(12) United States Patent
Kamal et al.

(10) Patent No.: US 6,492,876 B1
(45) Date of Patent: Dec. 10, 2002

(54) LOW POWER ANALOG EQUALIZER WITH VARIABLE OP-AMP GAIN

(75) Inventors: Abu-Hena Mostafa Kamal, Santa Clara, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/001,767

(22) Filed: Oct. 25, 2001

(51) Int. Cl.[7] .............................. H03F 3/04; H03F 3/45; H03F 1/34
(52) U.S. Cl. ..................... 330/304; 330/260; 330/294; 330/303; 330/305
(58) Field of Search ............................... 330/260, 294, 330/303, 304, 305

(56) References Cited

U.S. PATENT DOCUMENTS

| | | | |
|---|---|---|---|
| 4,207,543 A | * 6/1980 | Izakson et al. | 327/553 |
| 4,745,622 A | * 5/1988 | Gupta | 178/69 N |
| 5,455,843 A | 10/1995 | Cherubini et al. | 375/230 |
| 5,841,810 A | 11/1998 | Wong et al. | 375/232 |
| 6,034,566 A | * 3/2000 | Ohe | 330/305 |

FOREIGN PATENT DOCUMENTS

GB    2082370 A   * 3/1982   ............ G11B/5/45

OTHER PUBLICATIONS

Babanezhad, Joseph N.; "A 3.3V Analog Adaptive Line–Equalizer For Fast Ethernet Data Communication"; IEEE 1998 Custom Integrated Circuits Conference; pp. 343–346.

* cited by examiner

*Primary Examiner*—Patricia Nguyen

(57) ABSTRACT

A low power analog equalizer is disclosed that provides up to twenty decibels (20 dB) of alternating current gain in a single stage of analog signal equalization. The analog equalizer comprises an operational amplifier coupled to two half circuits. Each half circuit comprises an impedance network capable of receiving an analog input voltage and generating a current signal that is inversely proportional to frequency, a variable resistor capable of adjusting the gain of the operational amplifier, and a transistor and an amplifier coupled in a cascode configuration to create a low impedance node at the output of the impedance network. The analog equalizer is fabricated with 0.18 micron CMOS technology and operates at 1.8 volts.

48 Claims, 5 Drawing Sheets

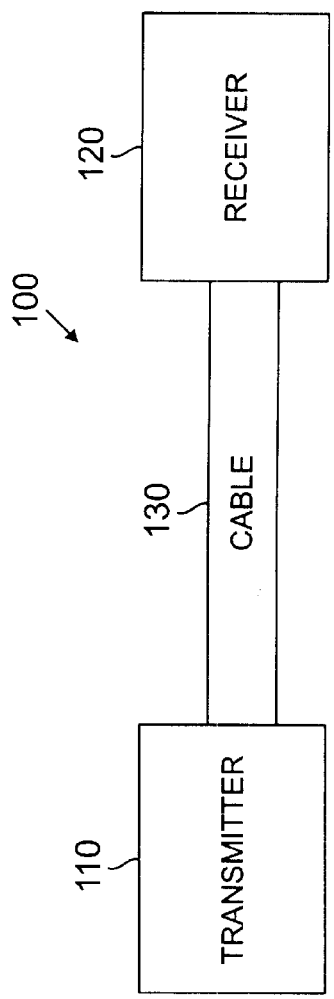
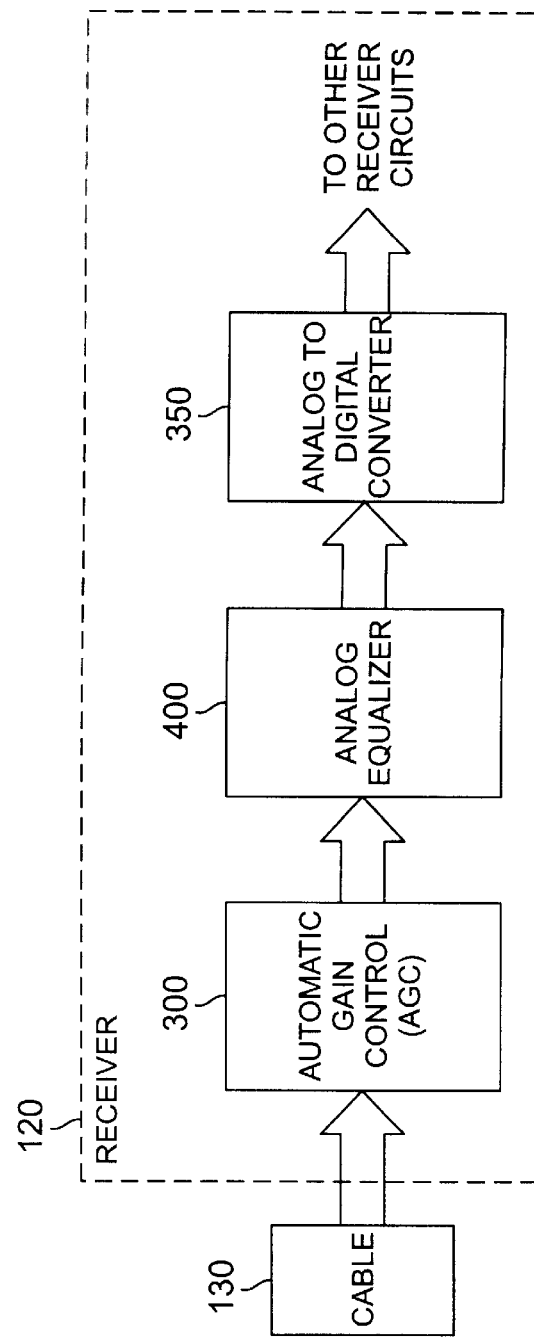
FIG. 1 (PRIOR ART)
FIG. 3

LOW POWER ANALOG EQUALIZER WITH VARIABLE OP-AMP GAIN

RELATED APPLICATION

A related patent application Ser. No. 10/001,628 by Abu-Hena M. Kamal, Ramsin M. Ziazadeh and Laurence D. Lewicki has been filed concurrently with this patent application entitled "Low Power Analog Equalizer with Current Mode Digital to Analog Converter". The related patent application and the present patent application are commonly assigned to the assignee of the present patent application.

FIELD OF THE INVENTION

The present invention relates generally to the field of analog equalizers. More particularly, the present invention provides an improved analog equalizer that is capable of adaptively compensating for analog signal distortions that are caused by transmitting an analog signal through a cable to a receiver.

BACKGROUND OF THE INVENTION

A gigabit data transmission rate is equal to the transmission of one billion ($10^9$) bits per second. The use of transceivers that are capable of gigabit data transmission rates is well known in digital communications technology. A gigabit Ethernet system enables data communication by transmitting and receiving data bits as analog signals over a Category 5 (CAT-5) unshielded twisted pair (UTP) cable. During the data communication process a receiver recovers the digital data from the transmitted analog signal. Data carrying signals are distorted severely as they are transmitted over a long cable length at a high frequency in the form of a multi level symbol alphabet, such as MLT-3 or PAM-17.

In such a case a gigabit receiver operates under several detrimental effects such as cable attenuation, echo from its own transmitter, etc. If channel distortion is not equalized or corrected, then the recovered clock signal from the received signal will be so erroneous that the recovered data will have an unacceptable bit error rate (BER), typically greater than $10^{-10}$. It is thus often necessary to improve the signal quality before attempting clock or data recovery. A cable equalizer circuit is implemented to compensate for the cable transmission loss and reshape the signal to its original (transmitted) waveform to improve inter-symbol interference (ISI) of the recovered data.

The transmission loss in decibels (dB) within the cable is linearly proportional to the cable length. The cable transmission loss in decibels (dB) is also proportional to the square root of the data transmission rate. The data transmission rate or transmission frequency and cable length are interdependent. An adaptive equalizer synthesizes a frequency response that is inversely proportional to that of the cable.

Various types of adaptive equalizers have been developed. Prior art adaptive equalizers improve signal quality either alone or in combination with digital finite impulse response (FIR) filters.

For example, U.S. Pat. No. 5,841,810 issued to Wong et al. on Nov. 24, 1998 describes a multistage adaptive equalizer. The input data signal in the Wong patent is successively filtered and magnitude weighted by successive adaptive filter circuits in accordance with corresponding adaptive control signals. In accordance with its respective adaptation control signal, each adaptive filter stage equalizes the data signal for a length of the cable through which the data signal was received. The adaptation control signal generator generates the individual adaptation control signals based upon an input equalization control signal. The input equalization control signal can be in, the form of an analog voltage or in the form of a multiple bit digital signal. Each adaptive filter stage is configured with a constant gain signal path connected in parallel with a high frequency boosted, variable gain signal path. The input data signal is amplified in accordance with a first signal gain G1 that is constant over frequency F to provide one of the input signals to a signal summer. The input signal is also amplified in accordance with a second signal gain G2 that increases with frequency in a manner that is complementary to the complex cable loss characteristic of the cable. The resulting high frequency boosted signal is then amplified in accordance with a third signal gain G3. While constant over frequency F, the third signal gain G3 is a function of the corresponding adaptation control signal. The resulting high frequency boosted, variable gain signal is then summed with the constant gain signal to provide the partially equalized signal.

Another type of analog adaptive equalizer is described in U.S. Pat. No. 5,455,843 issued to Cherubini et al. on Oct. 3, 1995. Another type of analog adaptive equalizer is described in an article entitled "A 3.3V Analog Adaptive Line-Equalizer For Fast Ethernet Data Communication" by J. N. Babanezhad in IEEE 1998 Custom Integrated Circuits Conference, pp. 343–346 (1998). Another type of device for equalizing channel distorted signals is described in U.S. Pat. No. 6,047,024 issued to How on Apr. 4, 2000.

It would be desirable to have an analog equalizer that is capable of operating at lower operating voltages than prior art analog equalizers.

It would also be desirable to have an analog equalizer that is capable of consuming less power than prior art analog equalizers.

It would also be desirable to have an analog equalizer that has a reduced die size compared to prior art analog equalizers.

SUMMARY OF THE INVENTION

The present invention is directed to an analog equalizer that is capable of adaptively compensating for analog signal distortions that are created during a gigabit data rate transmission of an analog signal through a cable to a receiver.

An advantageous embodiment of the present invention comprises an apparatus and method that adaptively compensates for gigabit channel impairment caused by the variation in channel length. A typical gigabit channel is a Category 5 (CAT-5) cable. The equalization created by the present invention provides a maximum boost of approximately twenty decibels (20 dB) which is sufficient to compensate for the attenuation experienced by a signal in a cable approximately one hundred twenty five meters (125 m) in length. The analog equalizer of the present invention synthesizes a frequency response that is inversely proportional to the frequency response of the cable. The analog equalizer of the present invention enables a one and eight tenths volt (1.8 volt) operation while significantly reducing power consumption and die size compared to prior art analog equalizers.

An advantageous embodiment of the present invention comprises a low impedance summing node in a regulated cascode configuration, an operational amplifier with a feedback network, and an impedance network comprised of passive resistors and capacitors to create an impedance profile that is inversely proportional to frequency. The impedance network is AC coupled to the low impedance summing node.

It is an object of the present invention to provide an apparatus and method for providing an analog equalizer that operates at a lower operating voltage than prior art analog equalizers.

It is another object of the present invention to provide an apparatus and method for providing an analog equalizer that consumes less power than prior art analog equalizers.

It is also an object of the present invention to provide an apparatus and method for providing an analog equalizer that has a smaller die size than prior art analog equalizers.

It is another object of the present invention to provide an apparatus and method for providing an analog equalizer that has greater linearity than prior art analog equalizers.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which:

FIG. 1 schematically illustrates a prior art data communication system comprising a transmitter and a receiver that is coupled to the transmitter by a cable that carries analog data signals;

FIG. 3 schematically illustrates a portion of a receiver that comprises an analog equalizer according to an advantageous embodiment of the present invention;

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data communication system.

FIG. 1 schematically illustrates a prior art data communication system 100 comprising a transmitter unit 110 and a receiver unit 120. Cable 130 couples the transmitter unit 110 to the receiver unit 120. Transmitter 110 is capable of transmitting analog signals at gigabit data transmission rates over cable 130. The analog signals suffer attenuation as they pass through cable 130 to receiver unit 120. The amount of attenuation suffered by the analog signals depends upon several factors. Such factors include the frequency at which the analog signals are transmitted and the length of cable 130.

Figure 2:
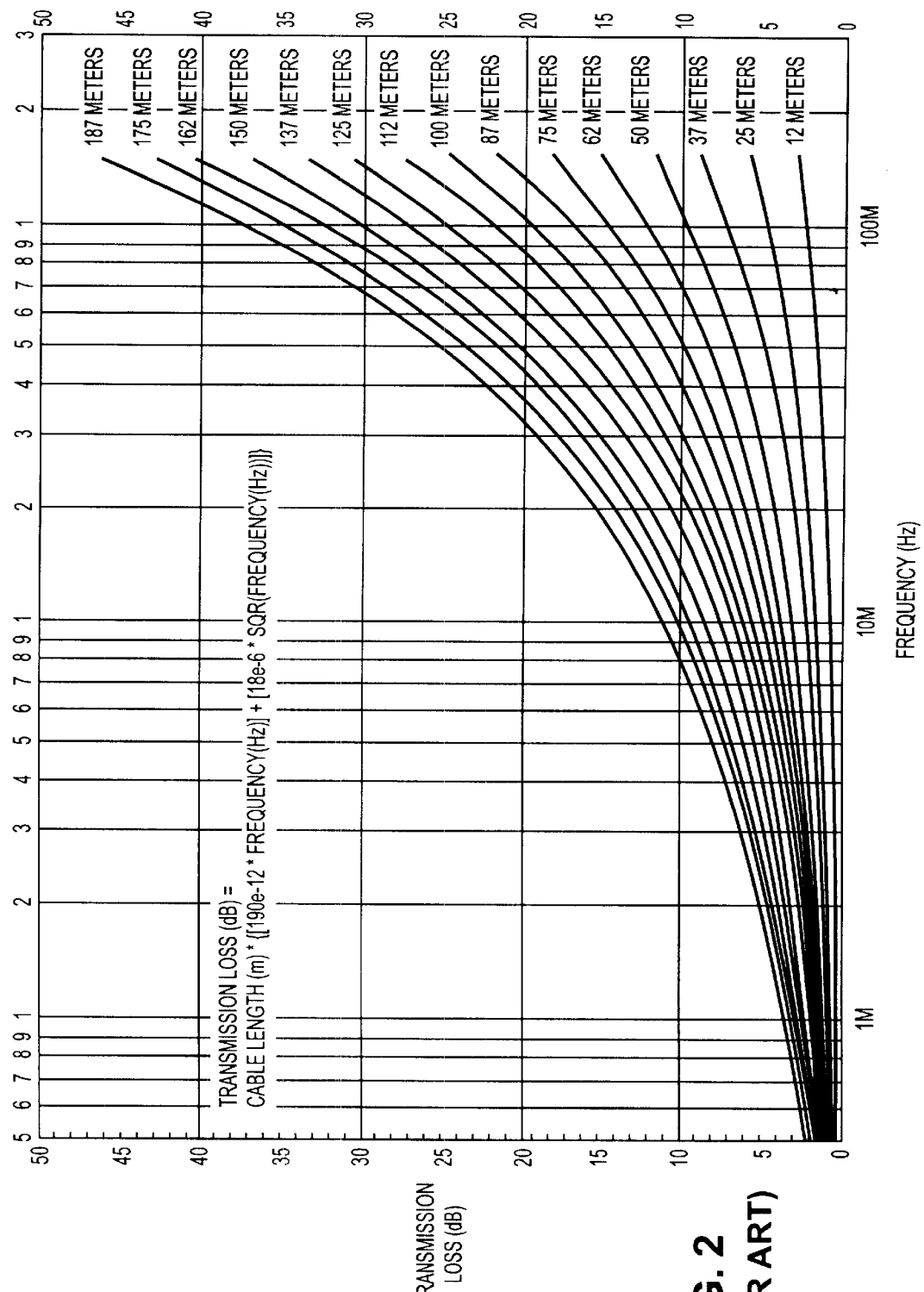
FIG. 2 illustrates a graph of transmission loss values as a function of frequency and cable length for Category 5 unshielded twisted pair (UTP) cable.

FIG. 2 illustrates a graph 200 of typical transmission loss values (dB) as a function of frequency (Hz) and cable length for Category 5 (CAT-5) unshielded twisted pair (UTP) cable. In FIG. 2 the transmission loss (TL) values in decibels (dB) are calculated as a function of frequency f in Hertz (Hz) and cable length (CL) in meters as follows:

$$TL=CL*\{[190*10^{-12}*f(Hz)]+[18*10^{-6}*\text{sqrt}(f(Hz))]\} \quad (1)$$

where the letters "sqrt" represent the square root operation. The value of the transmission loss in decibels (dB) is linearly proportional to the cable length. The value of the transmission loss in decibels (dB) is also proportional to the square root of the data transmission rate.

FIG. 3 schematically illustrates a portion of receiver 120 that comprises analog equalizer 400 according to an advantageous embodiment of the present invention. Analog signals from cable 130 are received in automatic gain control (AGC) unit 300. Analog equalizer 400 is coupled to and receives analog signals from automatic gain control (AGC) unit 300. Analog equalizer 400 of the present invention provides equalization to the analog signals received from automatic gain control (AGC) unit 300. The equalized analog signals from analog equalizer 400 are then sent to analog to digital converter (ADC) 350. The digital signals from ADC 350 are then provided to other circuits within receiver 120 for further processing.

Figure 4:
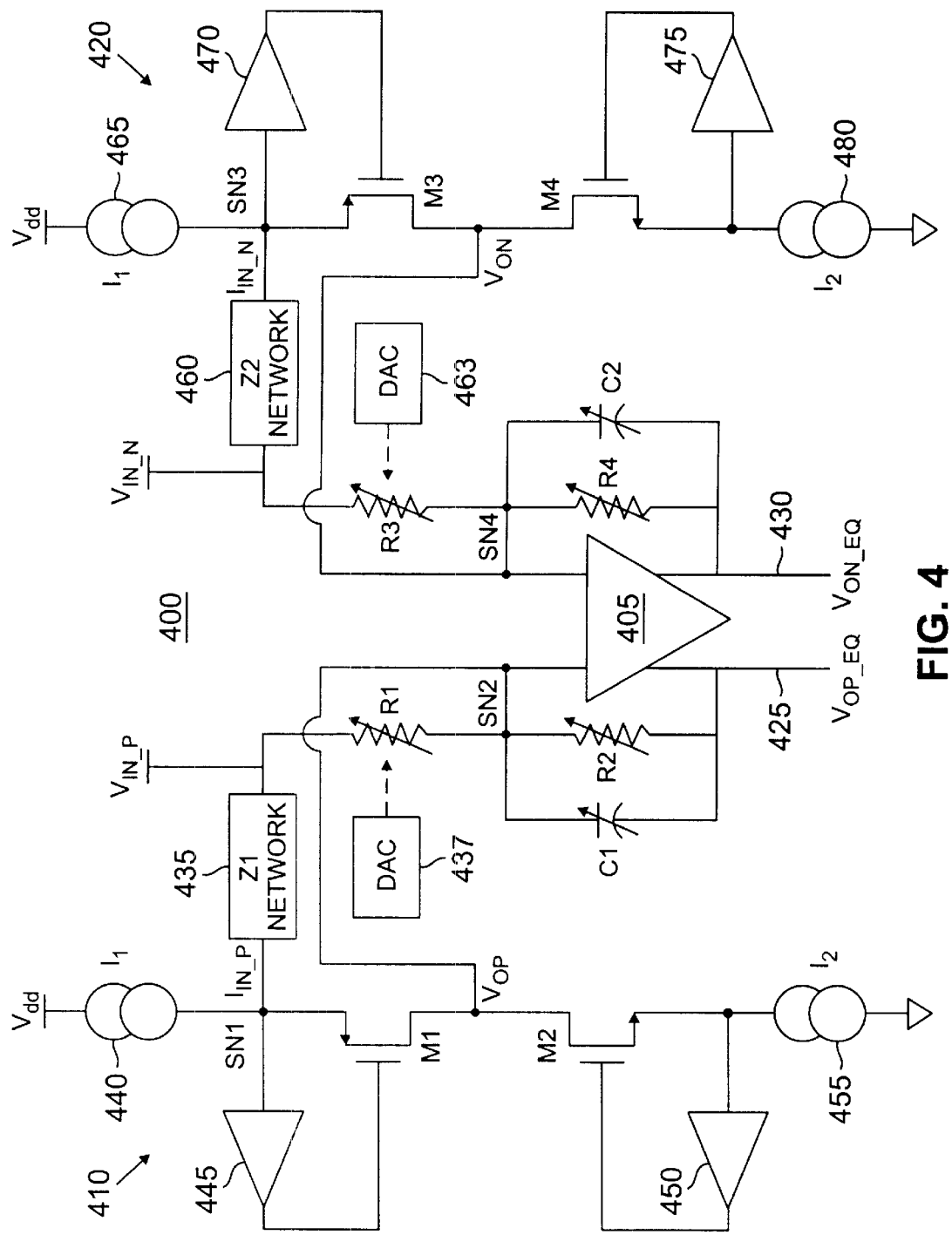
FIG. 4 schematically illustrates a more detailed circuit diagram of the analog equalizer of the present invention.

FIG. 4 schematically illustrates an analog equalizer 400 of the present invention. Analog equalizer 400 is symmetrical with respect to operational amplifier (op-amp) 405. That is, analog equalizer 400 comprises a first half circuit 410 (on the left side of op-amp 405 in FIG. 2) and a second half circuit 420 (on the right side of op-amp 405 in FIG. 4). Half circuit 410 is a mirror image with respect to the half circuit 420, and vice versa. Analog equalizer 400 uses an operating voltage of one and eight tenths volts (1.8 volt) and is fabricated using 0.18 micron (μm) complementary metal oxide semiconductor (CMOS) technology.

Half circuit 410 receives voltage signal $V_{IN\_P}$ as an input from automatic gain control (AGC) unit 300. Half circuit 410 provides equalization to voltage signal $V_{IN\_P}$. The equalized output signal ($V_{OP\_EQ}$) of voltage signal $V_{IN\_P}$ is output from op-amp 405 on output signal line 425. Similarly, half circuit 420 receives voltage signal $V_{IN\_N}$ as an input from automatic gain control (AGC) unit 300. Half circuit 420 provides equalization to voltage signal $V_{IN\_N}$. The equalized output signal ($V_{ON\_EQ}$) of voltage signal $V_{IN\_N}$ is output from op-amp 405 on output signal line 430. A typical frequency value for voltage signal $V_{IN\_P}$ and for voltage signal $V_{IN\_N}$ is sixty two and one half megaHertz (62.5 MHz).

The operation of half circuit 410 will be described first. As previously mentioned, voltage signal $V_{IN\_P}$ is obtained from the output of automatic gain control (AGC) unit 300. Voltage signal $V_{IN\_P}$ is provided simultaneously to Z1 network 435 and to a first terminal of variable resistor R1. The output of Z1 network 435 is coupled to low impedance node SN1. The letters "SN" stand for "summing node." A second terminal of variable resistor R1 is coupled to low impedance node SN2. SN2 is coupled to a first input of op-amp 405.

In one advantageous embodiment of the present invention, variable resistor R1 may take on a range of resistance values from 4.6 kilohms to 23.9 kilohms. The value of resistance of variable resistor R1 may be set using a digital to analog converter (DAC) 437. The use of a DAC to provide resistance settings in a variable resistor is well known in the art. In one advantageous embodiment of the present invention, a three (3) bit DAC is used to generate eight (8) separate settings, from a setting of all zero bits (000) for the lowest level of resistance to a setting of all one bits (111) for the highest level of resistance.

As shown in FIG. 4, a feedback network comprising variable resistor R2 and variable capacitor C1 is coupled in parallel with op-amp 405. A first terminal of variable resistor R2 and a first terminal of variable capacitor C1 are each coupled to low impedance node SN2. A second terminal of variable resistor R2 and a second terminal of variable capacitor C1 are coupled to output signal line 425. The feedback network comprising variable resistor R2 and variable capacitor C1 provides a low pass filter and a current to voltage converter for op-amp 405. In one advantageous embodiment of the present invention, the value of variable resistor R1 and the value of variable resistor R2 are equal in order to maintain unity direct current (DC) gain. In one advantageous embodiment of the present invention, variable resistor R2 may take on a range of resistance values from 4.6 kilohms to 23.9 kilohms, variable capacitor C1 may take on a range of capacitance values from 288.0 femtofarads to 55.5 femtofarads. A femtofarad is $10^{-15}$ farad. A digital to analog converter (DAC) (not shown) may be used to set the value of the resistance in variable resistor R2 and the value of the capacitance in variable capacitor C1.

The output of Z1 network 435 is AC coupled to low impedance node SN1. Z1 network 435 converts the input voltage signal $V_{IN\_P}$ to a current signal $I_{IN\_P}$. The current signal $I_{IN\_P}$ that is output from Z1 network 435 is combined at low impedance node SN1 with a bias current $I_1$ from current source 440.

Figure 5:
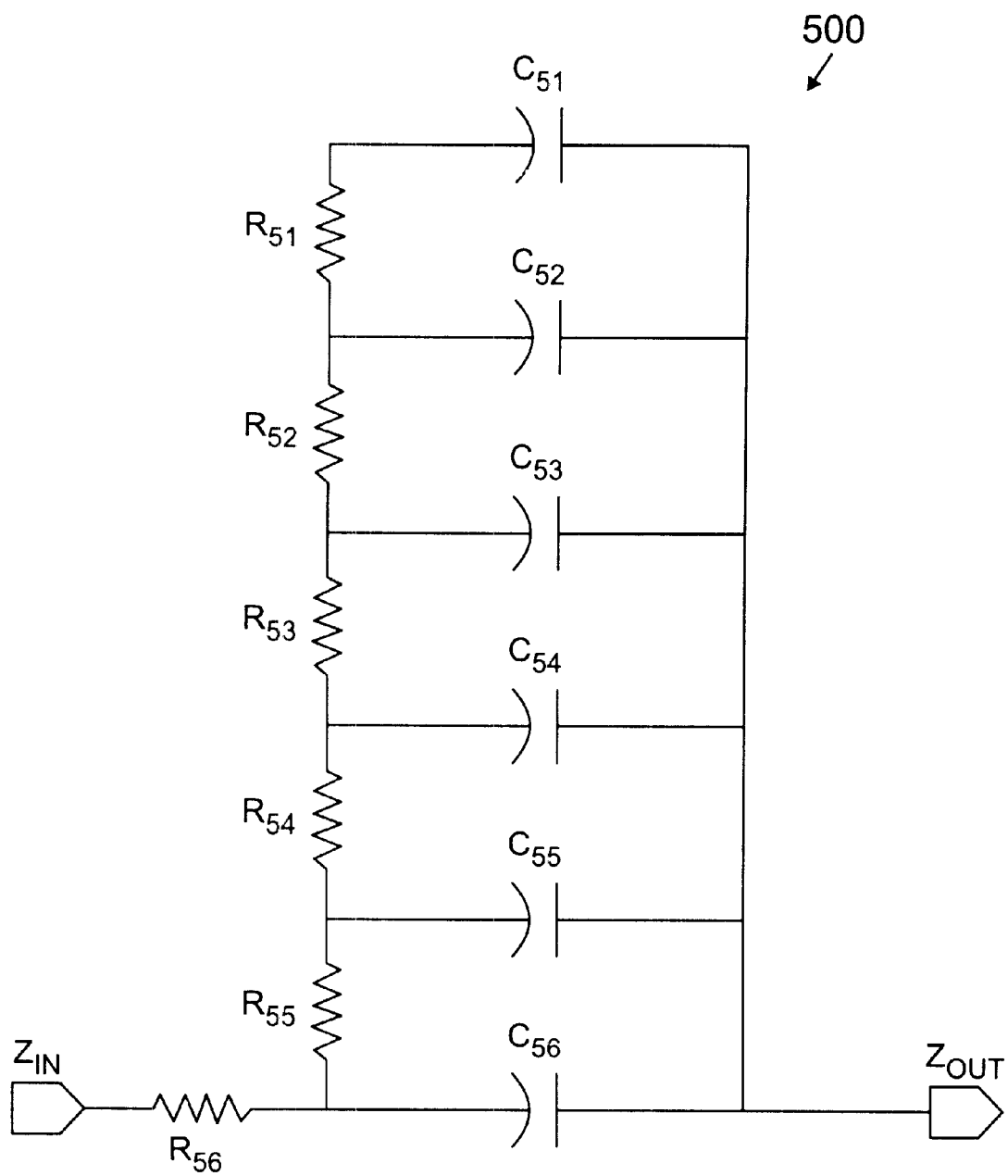
FIG. 5 schematically illustrates an impedance network adapted for use with the analog equalizer of the present invention.

In one advantageous embodiment of the present invention, Z1 network 435 comprises a passive network 500 of resistors and capacitors as shown in FIG. 5. In one advantageous embodiment of passive network 500, the resistors may have the following values: $R_{51}$ is 29.0 kilohms, $R_{52}$ is 6.5 kilohms, $R_{53}$ is 6.5 kilohms, $R_{54}$ is 6.5 kilohms, $R_{55}$ is 4.0 kilohms, and $R_{56}$ is 500.0 ohms. In addition, the capacitors may have the following values: $C_{51}$ is 3.6 picofarads, $C_{52}$ is 1.2 picofarads, $C_{53}$ is 1.2 picofarads, $C_{54}$ is 1.2 picofarads, $C_{55}$ is picofarads, and $C_{56}$ is 1.2 picofarads. A picofarad is $10^{-12}$ farad. The effective impedance of passive network 500 at 62.5 MHz is approximately two and one half kilohms (2.5 kilohms).

Passive network 500 is only one example of Z1 network 435. The present invention is not limited to the specific Z1 network shown in FIG. 5. It is understood that other types of passive networks comprising resistors and capacitors may also be used.

As shown in FIG. 4, a first cascode configuration comprising amplifier 445 and transistor M1 creates low impedance node SN1. The source of transistor M1 is coupled to the input of amplifier 445. This arrangement creates low impedance node SN1 between transistor M1 and amplifier 445. The output of amplifier 445 is coupled to the gate of transistor M1. The bias current $I_1$ and the current $I_{IN\_P}$ are summed at low impedance node SN1 and then flow through transistor M1. The drain of transistor M1 is coupled to low impedance node SN2. The voltage signal at the drain of transistor M1 is equal to $V_{OP}$. The voltage signal $V_{OP}$ is provided to a first input of op-amp 405 which is low impedance node SN2.

The current $I_{IN\_P}$ is summed with the current that flows through variable resistor R1 at low impedance node SN2. The combined current then flows through the feedback network of operational amplifier 405 comprising variable resistor R2 and variable capacitor C1.

The drain of transistor M1 is also coupled to the drain of transistor M2. Transistor M2 and amplifier 450 comprise a second cascode configuration. The input of amplifier 450 is coupled to the source of transistor M2 and the output of amplifier 450 is coupled to the gate of transistor M2. The input of amplifier 450 and the source of transistor M2 are coupled to current source 455. Current source 455 generates a bias current equal to $I_2$.

The overall gain $A_P$ of half circuit 410 can be calculated as follows:

$$A_P = \frac{V_{OP\_EQ}}{V_{IN\_P}} = \frac{R2}{Z1(f)} + \frac{R2}{R1} \qquad (2)$$

where Z1(f) is the impedance of Z1 network 435. The impedance Z1(f) of Z1 network 435 is a function of frequency. Impedance Z1 is composed of resistors ($R_{51}$ through $R_{56}$) and capacitors ($C_{51}$ through $C_{56}$). Impedance Z1 decreases with frequency causing the input current $I_{IN\_P}$ to increase with frequency.

If Z1 is assumed to be a simple series circuit of resistance R and capacitance C, and if the feedback capacitor C1 is assumed to be zero, then the transfer function, $H_p(S)$, of half circuit 420 can be derived to be:

$$H_p(s) = \left(1 + \frac{R2}{R}\right)\frac{(s+z)}{(s+p)} \qquad (3)$$

where the zero z is equal to:

$$z = \frac{1}{C(R2+R)} \quad (4)$$

and the pole p is equal to:

$$p = \frac{1}{RC} \quad (5)$$

where R2 is a value of resistance of variable resistor R2.

The operation of half circuit 420 is similar to the operation of half circuit 410. Voltage signal $V_{IN\_N}$ is obtained from the output of automatic gain control (AGC) unit 300. Voltage signal $V_{IN\_N}$ is provided simultaneously to Z2 network 460 and to a first terminal of variable resistor R3. The output of Z2 network 460 is coupled to low impedance node SN3. A second terminal of variable resistor R3 is coupled to low impedance node SN4. SN4 is coupled to a second input of op-amp 405.

In one advantageous embodiment of the present invention, variable resistor R3 may take on a range of resistance values from 4.6 kilohms to 23.9 kilohms. The value of resistance of variable resistor R3 may be set using a digital to analog converter (DAC) 463. The use of a DAC to provide resistance settings in a variable resistor is well known in the art. In one advantageous embodiment of the present invention, a three (3) bit DAC is used to generate eight (8) separate settings, from a setting of all zero bits (000) for the lowest level of resistance to a setting of all one bits (111) for the highest level of resistance.

As shown in FIG. 4, a feedback network comprising variable resistor R4 and variable capacitor C2 is coupled in parallel with op-amp 405. A first terminal of variable resistor R4 and a first terminal of variable capacitor C2 are each coupled to low impedance node SN4. A second terminal of variable resistor R4 and a second terminal of variable capacitor C2 are coupled to output signal line 430. The feedback network comprising variable resistor R4 and variable capacitor C2 provides a low pass filter and a current to voltage converter for op-amp 405. In one advantageous embodiment of the present invention, the value of variable resistor R3 and the value of variable resistor R4 are equal in order to maintain zero direct current (DC) gain. In one advantageous embodiment of the present invention, variable resistor R4 may take on a range of resistance values from 4.6 kilohms to 23.9 kilohms, variable capacitor C2 may take on a range of capacitance values from 288.0 femtofarads to 55.5 femtofarads. A femtofarad is $10^{-15}$ farad. digital to analog converter (DAC) (not shown) may be used to set the value of the resistance in variable resistor R4 and the value of the capacitance in variable capacitor C2.

The output of Z2 network 460 is AC coupled to low impedance node SN3. Z2 network 460 converts the input voltage signal $V_{IN\_N}$ to a current signal $I_{IN\_N}$. The current signal $I_{IN\_N}$ that is output from Z2 network 460 is combined at low impedance node SN3 with a bias current $I_l$ from current source 465.

In one advantageous embodiment of the present invention, Z2 network 460 comprises a passive network 500 of resistors and capacitors as shown in FIG. 5. Passive network 500 is only one example of Z2 network 460. The present invention is not limited to the specific Z2 network shown in FIG. 5. It is understood that other types of passive networks comprising resistors and capacitors may also be used.

As shown in FIG. 4, a third cascode configuration comprising amplifier 470 and transistor M3 creates low impedance node SN3. The source of transistor M3 is coupled to the input of amplifier 470. This arrangement creates low impedance node SN3 between transistor M3 and amplifier 470. The output of amplifier 470 is coupled to the gate of transistor M3. The bias current $I_1$ and the current $I_{IN\_N}$ are summed at low impedance node SN3 and then flow through transistor M3. The drain of transistor M3 is coupled to low impedance node SN4. The voltage signal at the drain of transistor M3 is equal to $V_{ON}$. The voltage signal $V_{ON}$ is provided to a second input of op-amp 405 which is low impedance node SN4.

The current $I_{IN\_N}$ is summed with the current that flows through variable resistor R3 at low impedance node SN4. The combined current then flows through the feedback network of operational amplifier 405 comprising variable resistor R4 and variable capacitor C2.

The drain of transistor M3 is also coupled to the drain of transistor M4. Transistor M4 and amplifier 475 comprise a fourth cascode configuration. The input of amplifier 475 is coupled to the source of transistor M4 and the output of amplifier 475 is coupled to the gate of transistor M4. The input of amplifier 475 and the source of transistor M4 are coupled to current source 480. Current source 480 generates a bias current equal to $I_2$.

The overall gain $A_N$ of half circuit 420 can be calculated as follows:

$$A_N = \frac{V_{ON\_EQ}}{V_{IN\_N}} = \frac{R4}{Z2(f)} + \frac{R4}{R3} \quad (6)$$

where Z2(f) is the impedance of Z2 network 460. The impedance Z2(f) of Z2 network 435 is a function of frequency. Impedance Z2 is composed of resistors ($R_{51}$ through $R_{56}$) and capacitors ($C_{51}$ through $C_{56}$). Impedance Z2 decreases with frequency causing the input current $I_{IN\_N}$ to increase with frequency.

If Z2 is assumed to be a simple series circuit of resistance R and capacitance C, and if the feedback capacitor C2 is assumed to be zero, then the transfer function, $H_N(S)$, of half circuit 420 can be derived to be:

$$H_N(s) = \left(1 + \frac{R4}{R}\right)\frac{(s+z)}{(s+p)} \quad (7)$$

where the zero z is equal to:

$$z = \frac{1}{C(R4+R)} \quad (8)$$

and the pole p is equal to:

$$p = \frac{1}{RC} \quad (9)$$

where R4 is a value of resistance of variable resistor R4.

In one advantageous embodiment of the present invention analog equalizer 400 has seven (7) gain steps. A three (3) bit DAC unit (not shown) for controlling the resistance of the variable resistors (and the capacitance of the variable capacitors) can be set to values between zero (0) and seven (7) depending upon the strength of the analog input signals, $V_{IN\_P}$ and $V_{IN\_N}$.

When attenuation in the channel is at a maximum level, analog equalizer 400 must provide a maximum level of equalization. The maximum level of equalization corresponds to the largest setting of the DAC unit. The largest setting of the DAC unit is level seven (7) corresponding to all three (3) DAC input bits set equal to one (1). The smallest setting of the DAC unit is level zero (0) corresponding to all three (3) DAC input bits set equal to zero (0). Analog equalizer 400 produces no equalization gain when the DAC unit is set at level zero (0). Analog equalizer 400 produces maximum equalization gain with the DAC unit is set at level seven (7).

The alternating current (AC) gain provided by analog equalizer 400 (as a function of the DAC settings) for a frequency of 62.5 MHz for a slow process, at a temperature of one hundred fifty degrees Centigrade (150° C.), with a power supply voltage equal to 1.6 volts, is given below in the following table.

| DAC Setting | Gain (dB) |
| --- | --- |
| 0 | −1.80 |
| 1 | 7.61 |
| 2 | 11.42 |
| 3 | 13.79 |
| 4 | 16.31 |
| 5 | 17.86 |
| 6 | 19.21 |
| 7 | 20.34 |

The alternating current (AC) gain provided by analog equalizer 400 (as a function of analog input signal frequency) at three different frequencies for a slow process, at a temperature of one hundred fifty degrees Centigrade (150° C.) with a power supply voltage equal to 1.6 volts, is given below in the following table.

| Analog signal input frequency (MHz) | Gain at minimum DAC Setting (dB) | Gain at maximum DAC setting (dB) |
| --- | --- | --- |
| 1.0 | 0.96 | 5.12 |
| 30.0 | 6.79 | 18.28 |
| 62.5 | 7.61 | 20.34 |

Figure 6:
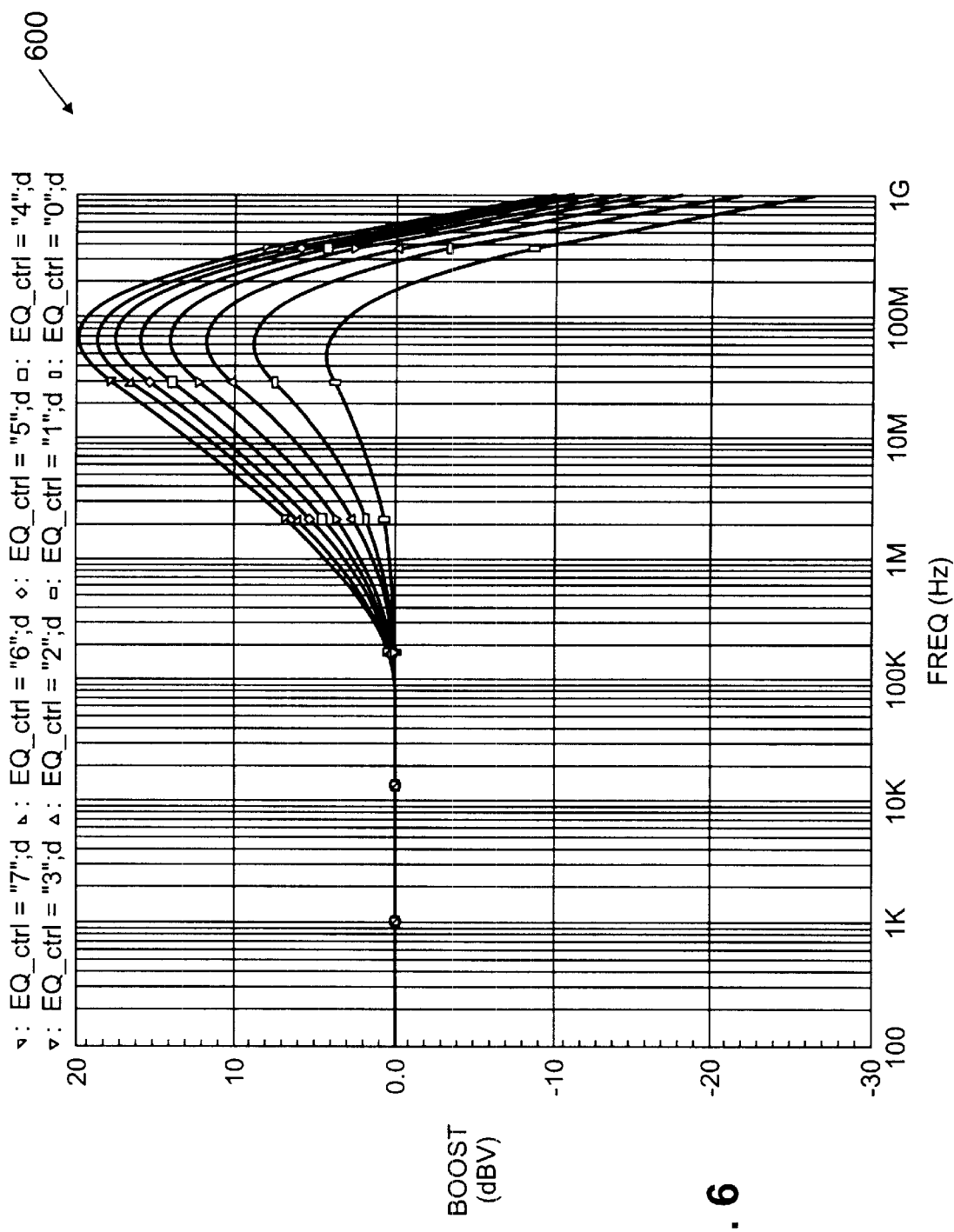
FIG. 6 illustrates a graph of alternating current gain provided by the analog equalizer of the present invention as a function of frequency.

FIG. 6 illustrates a graph of AC gain response provided by the analog equalizer 400 as a function a frequency. The designation "EQ_ctrl" in FIG. 6 refers to a DAC setting. For example, EQ_ctrl=7 signifies the maximum DAC setting and EQ_ctrl=0 signifies the minimum (zero) DAC setting. The maximum amount of AC gain is approximately twenty decibels (20 dB).

Analog equalizer 400 of the present invention provides a significantly improved apparatus and method of analog signal equalization compared to the prior art. For example, analog equalizer 400 uses an operating voltage of one and eight tenths volts (1.8 volts). The analog equalizer described in U.S. Pat. No. 5,841,810 issued to Wong et al. on Nov. 24, 1998 (the "Wong patent") uses an operating voltage of three and three tenths volts (3.3 volts). A 3.3 volt analog equalizer is also described in a prior art article entitled "A 3.3V Analog Adaptive Line-Equalizer For Fast Ethernet Data Communication" by J. N. Babanezhad in IEEE 1998 Custom Integrated Circuits Conference, pp. 343–346 (1998). Analog equalizer 400 of the present invention provides equalization of analog signals using a lower operating voltage than that of prior art analog equalizers.

Analog equalizer 400 of the present invention also consumes less power than prior art analog equalizers. Analog equalizer 400 uses less than three milliamps (3 mA) of current at 1.8 volts. The analog equalizer of the Wong patent uses twenty four milliamps (24 mA) of current at 3.3 volts. Analog equalizer 400 of the present invention provides equalization of analog signals while consuming less power than prior art analog equalizers.

Analog equalizer 400 of the present invention also has a smaller die size than prior art analog equalizers. Analog equalizer 400 uses less than one fourth of the die size used by the analog equalizer of the Wong patent.

Analog equalizer 400 of the present invention also provides greater linearity compared to prior art analog equalizers. Analog equalizer 400 provides more than sixty decibels (60 dB) of linearity compared to less than forty decibels (40 dB) of linearity provided by the analog equalizer of the Wong patent.

In addition, the Wong patent provides equalization to analog signals by using a plurality of boost stages. Each boost stage provides a portion of the total gain needed to compensate for the total cable transmission loss. In contrast, analog equalizer 400 of the present invention comprises a single stage equalizer that is capable of generating up to twenty decibels (20 dB) of gain.

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. An analog equalizer comprising:

an operational amplifier;

a first half circuit coupled to a first input of said operational amplifier, said first half circuit capable of providing alternating current gain to a first input voltage signal provided to a first input of said analog equalizer, said first half circuit comprising:

a first impedance network having an input coupled to said first input of said analog equalizer and having an output coupled to a first low impedance node, said first impedance network having an impedance Z1 that generates an output current signal that is inversely proportional to frequency;

a first variable resistor R1 having an input coupled to said first input of said analog equalizer and having an output coupled to a second low impedance node coupled to said first input of said operational amplifier;

a first transistor and a first amplifier coupled together in a cascode configuration to create said first low impedance node, wherein an output current from said first transistor is coupled to said second low impedance node; and a first feedback network coupled to said second low impedance node and to a first output signal line of said operational amplifier.

2. An analog equalizer as claimed in claim 1 further comprising a second transistor and a second amplifier coupled together in a cascode configuration and coupled to an output of said first transistor.

3. An analog equalizer as claimed in claim 1 wherein said first feedback network comprises a second variable resistor R2 and a first variable capacitor C1 coupled in parallel to provide a low pass filter and a current to voltage converter for said first output signal line of said operational amplifier.

4. An analog equalizer as claimed in claim 3 wherein a value of resistance of first variable resistor R1 and a value of resistance of second variable resistor R2 are equal to maintain unity direct current gain.

5. An analog equalizer as claimed in claim 3 wherein an overall gain $A_p$ of said first half circuit is equal to:

$$A_P = \frac{R2}{Z1(f)} + \frac{R2}{R1}$$

where Z1(f) is an impedance of said first impedance network as a function of frequency, and R1 is a value of resistance of said first variable resistor R1, and R2 is a value of resistance of said second variable resistor R2.

6. An analog equalizer as claimed in claim 5 wherein said first impedance network is a series circuit of resistance R and capacitance C, and wherein variable capacitor C1 is zero, and wherein a transfer function $H_p(S)$ of said first half circuit is equal to:

$$H_p(s) = \left(1 + \frac{R2}{R}\right)\frac{(s+z)}{(s+p)}$$

wherein zero z is equal to:

$$z = \frac{1}{C(R2 + R)}$$

and wherein pole p is equal to:

$$p = \frac{1}{RC}$$

where R2 is a value of resistance of said second variable resistor R2.

7. An analog equalizer as claimed in claim 1 wherein said first variable resistor R1 is capable of being set to have a value of resistance within a range of 4.6 kilohms to 23.9 kilohms, wherein each value of resistance in said range of resistances for first variable resistor R1 provides a level of alternating current gain within said first half circuit of said analog equalizer.

8. An analog equalizer as claimed in claim 7 comprising a first digital to analog converter capable of varying the values of resistance of said first variable resistor R1.

9. An analog equalizer as claimed in claim 8 wherein said first digital to analog converter comprises a three input bit digital to analog converter capable of setting eight levels of resistance in said first variable resistor R1.

10. An analog equalizer as claimed in claim 3 wherein said second variable resistor R2 is capable of being set to have values of resistance from 4.6 kilohms to 23.9 kilohms and said first variable capacitor C1 is capable of being set to have values of capacitance from 288.0 femtofarads to 55.5 femtofarads.

11. An analog equalizer as claimed in claim 1 capable of operating at an operating voltage of approximately one and eight tenths volts (1.8 volts).

12. An analog equalizer as claimed in claim 1 fabricated using 0.18 micron complementary metal oxide semiconductor technology.

13. An analog equalizer as claimed in claim 1 wherein said analog equalizer comprises a single stage equalizer capable of providing up to twenty decibels (20 dB) of alternating current gain.

14. An analog equalizer as claimed in claim 1 wherein said first input of said analog equalizer is coupled to an output of an automatic gain control circuit and receives said first input voltage signal from said automatic gain control circuit.

15. An analog equalizer as claimed in claim 14 wherein said first input voltage signal has a maximum frequency value of approximately sixty two and one half megaHertz (62.5 MHz).

16. An analog equalizer as claimed in claim 1 wherein said first impedance network comprises a passive network of resistors and capacitors.

17. An analog equalizer as claimed in claim 1 further comprising:
   a second half circuit coupled to a second input of said operational amplifier, said second half circuit capable of providing alternating current gain to a second input voltage signal provided to a second input of said analog equalizer, said second half circuit comprising:
      a second impedance network having an input coupled to said second input of said analog equalizer and having an output coupled to a third low impedance node, said second impedance network having an impedance Z2 that generates an output current signal that is inversely proportional to frequency;
      a second variable resistor R3 having an input coupled to said second input of said analog equalizer and having an output coupled to a fourth low impedance node coupled to said second input of said operational amplifier;
      a third transistor and a third amplifier coupled together in a cascode configuration to create said third low impedance node, wherein an output current from said third transistor is coupled to said fourth low impedance node; and
      a second feedback network coupled to said fourth low impedance node and to a second output signal line of said operational amplifier.

18. An analog equalizer as claimed in claim 17 further comprising a fourth transistor and a fourth amplifier coupled together in a cascode configuration and coupled to an output of said third transistor.

19. An analog equalizer as claimed in claim 17 wherein said second feedback network comprises a fourth variable resistor R4 and a second variable capacitor C2 coupled in parallel to provide a low pass filter and a current to voltage converter for said second output signal line of said operational amplifier.

20. An analog equalizer as claimed in claim 19 wherein a value of resistance of third variable resistor R3 and a value of resistance of fourth variable resistor R4 are equal to maintain unity direct current gain.

21. An analog equalizer as claimed in claim 20 wherein an overall gain $A_N$ of said second half circuit is equal to:

$$A_N = \frac{R4}{Z2(f)} + \frac{R4}{R3}$$

where Z2(f) is an impedance of said second impedance network as a function of frequency, and R3 is a value of resistance of said third variable resistor R3, and R4 is a value of resistance of said fourth variable resistor R4.

22. An analog equalizer as claimed in claim 21 wherein said second impedance network is a series circuit of resistance R and capacitance C, and wherein variable capacitor C2 is zero, and wherein a transfer function $H_N(S)$ of said first half circuit is equal to:

$$H_N(s) = \left(1 + \frac{R4}{R}\right)\frac{(s+z)}{(s+p)}$$

wherein zero z is equal to:

$$z = \frac{1}{C(R4+R)}$$

and wherein pole p is equal to:

$$p = \frac{1}{RC}$$

where R4 is a value of resistance of said fourth variable resistor R4.

23. An analog equalizer as claimed in claim 17 wherein said third variable resistor R3 is capable of being set to have a value of resistance within a range of 4.6 kilohms to 23.9 kilohms, wherein each value of resistance in said range of resistances for third variable resistor R3 provides a level of alternating current gain within said second half circuit of said analog equalizer.

24. An analog equalizer as claimed in claim 23 comprising a second digital to analog converter capable of varying the values of resistance of said third variable resistor R3.

25. An analog equalizer as claimed in claim 24 wherein said second digital to analog converter comprises a three input bit digital to analog converter capable of setting eight levels of resistance in said third variable resistor R3.

26. An analog equalizer as claimed in claim 19 wherein said fourth variable resistor R4 is capable of being set to have values of resistance from 4.6 kilohms to 23.9 kilohms and said second variable capacitor C2 is capable of being set to have values of capacitance from 288.0 femtofarads to 55.5 femtofarads.

27. An analog equalizer as claimed in claim 17 capable of operating at an operating voltage of approximately one and eight tenths volts (1.8 volts).

28. An analog equalizer as claimed in claim 17 fabricated using 0.18 micron complementary metal oxide semiconductor technology.

29. An analog equalizer as claimed in claim 17 wherein said analog equalizer comprises a single stage equalizer capable of providing up to twenty decibels (20 dB) of alternating current gain.

30. An analog equalizer as claimed in claim 17 wherein said second input of said analog equalizer is coupled to an output of an automatic gain control circuit and receives said second input voltage signal from said automatic gain control circuit.

31. An analog equalizer as claimed in claim 30 wherein said second input voltage signal has a maximum frequency value of approximately sixty two and one half megahertz (62.5 MHz).

32. An analog equalizer as claimed in claim 17 wherein said second impedance network comprises a passive network of resistors and capacitors.

33. A method for equalizing an analog input voltage signal, said method comprising the steps of:
providing a first analog input voltage signal to a first input of an analog equalizer;
providing said first analog input voltage signal to a first impedance network of said analog equalizer, said first impedance network having an output coupled to a first low impedance node;
providing said first analog input voltage signal to a first variable resistor R1 of said analog equalizer, said first variable resistor R1 having an output coupled to a second low impedance node coupled to a first input of an operational amplifier of said analog equalizer;
generating a current signal at an output of said first impedance network that is inversely proportional to frequency;
providing said current signal from said first impedance network to a first transistor and a first amplifier coupled together in a cascode configuration to create said first low impedance node;
providing an output current signal from said first transistor to said second low impedance node;
providing to said first input of said operational amplifier a current signal at said second low impedance node that combines said output current signal from said first transistor and a current signal from said first variable resistor; and
setting a value of alternating current gain for said current signal provided to said first input of said operational amplifier by setting a value of resistance for first variable resistor R1.

34. A method as claimed in claim 33 further comprising the step of:
providing said current signal at. said second low impedance node to a feedback network coupled to said operational amplifier wherein said feedback network comprises a second variable resistor R2 and a first variable capacitor C1 coupled in parallel.

35. A method as claimed in claim 34 further comprising the step of:
setting a value of resistance of said first variable resistor R1 equal to a value of resistance of said second variable resistor R2 to maintain unity direct current gain.

36. A method as claimed in claim 34 wherein a value of gain $A_P$ provided to said first input voltage signal is equal to:

$$A_P = \frac{R2}{Z1(f)} + \frac{R2}{R1}$$

where Z1(f) is an impedance of said first impedance network as a function of frequency, and R1 is a value of resistance of said first variable resistor R1, and R2 is a value of resistance of said second variable resistor R2.

37. A method as claimed in claim 36 wherein said first impedance network is a series RC circuit of resistance R and capacitance C, and wherein variable capacitor C1 is zero, and wherein a transfer function $H_p(S)$ for a first half circuit of said analog equalizer that provides gain to said first input voltage signal is equal to:

$$H_p(s) = \left(1 + \frac{R2}{R}\right)\frac{(s+z)}{(s+p)}$$

wherein zero z is equal to:

$$z = \frac{1}{C1(R2+R)}$$

and wherein pole p is equal to:

$$p = \frac{1}{RC}$$

where R2 is a value of resistance of said second variable resistor R2.

38. A method as claimed in claim 33 wherein said step of setting a value of alternating current gain for said current signal provided to said first input of said operational amplifier by setting a value of resistance for first variable resistor R1 comprises the steps of:
    coupling a digital to analog converter to said first variable resistor R1, and to said second variable resistor R2, and to said first variable capacitor C1; and
    providing a digital input signal to said digital to analog converter, said digital input signal selecting a level of resistance in said first variable resistor R1, and a level of resistance in said second variable resistor R2, and a level of capacitance in said first variable capacitor C1.

39. A method as claimed in claim 33 further comprising the steps of:
    fabricating said analog equalizer with 0.18 micron complementary metal oxide semiconductor technology; and
    operating said analog equalizer at an operating voltage of approximately one and eight tenths volts (1.8 volts).

40. A method as claimed in claim 33 further comprising the step of:
    providing up to twenty decibels (20 dB) of alternating current gain to said first input voltage signal in a single stage of analog signal equalization.

41. A method for equalizing an analog input voltage signal as claimed in claim 33, said method further comprising the steps of:
    providing a second analog input voltage signal to a second input of said analog equalizer;
    providing said second analog input voltage signal to a second impedance network of said analog equalizer, said second impedance network having an output coupled to a third low impedance node;
    providing said second analog input voltage signal to a third variable resistor R3 of said analog equalizer, said third variable resistor R3 having an output coupled to a fourth low impedance node coupled to a second input of said operational amplifier of said analog equalizer;
    generating a current signal at an output of said second impedance network that is inversely proportional to frequency;
    providing said current signal from said second impedance network to a third transistor and a third amplifier coupled together in a cascode configuration to create said third low impedance node;
    providing an output current signal from said third transistor to said fourth low impedance node;
    providing to said second input of said operational amplifier a current signal at said fourth low impedance node that combines said output current signal from said third transistor and a current signal from said third variable resistor; and
    setting a value of alternating current gain for said current signal provided to said second input of said operational amplifier by setting a value of resistance for third variable resistor R3.

42. A method as claimed in claim 41 further comprising the step of:
    providing said current signal at said fourth low impedance node to a feedback network coupled to said operational amplifier wherein said feedback network comprises a fourth variable resistor R4 and a second variable capacitor C2 coupled in parallel.

43. A method as claimed in claim 42 further comprising the step of:
    setting a value of resistance of said third variable resistor R3 equal to a value of resistance of said fourth variable resistor R4 to maintain unity direct current gain.

44. A method as claimed in claim 42 wherein a value of gain $A_N$ provided to said second input voltage signal is equal to:

$$A_N = \frac{R4}{Z2(f)} + \frac{R4}{R3}$$

where Z2(f) is an impedance of said second impedance network as a function of frequency, and R3 is a value of resistance of said third variable resistor R3, and R4 is a value of resistance of said fourth variable resistor R4.

45. A method as claimed in claim 44 wherein said second impedance network is a series circuit of resistance R and capacitance C, and wherein variable capacitor C2 is zero, and wherein a transfer function $H_p(S)$ for a second half circuit of said analog equalizer that provides gain to said second input voltage signal is equal to:

$$H_N(s) = \left(1 + \frac{R4}{R}\right)\frac{(s+z)}{(s+p)}$$

wherein zero z is equal to:

$$z = \frac{1}{C(R4+R)}$$

and wherein pole p is equal to:

$$p = \frac{1}{RC}$$

where R4 is a value of resistance of said fourth variable resistor R4.

46. A method as claimed in claim 41 wherein said step of setting a value of alternating current gain for said current signal provided to said second input of said operational amplifier by setting a value of resistance for third variable resistor R3 comprises the steps of:
    coupling a digital to analog converter to said third variable resistor R3, and to said fourth variable resistor R4, and to said second variable capacitor C2; and
    providing a digital input signal to said digital to analog converter, said digital input signal selecting a level of resistance in said third variable resistor R3, and a level of resistance in said fourth variable resistor R4, and a level of capacitance in said second variable capacitor C2.

47. A method as claimed in claim 41 further comprising the steps of:
  fabricating said analog equalizer with 0.18 micron complementary metal oxide semiconductor technology; and
  operating said analog equalizer at an operating voltage of approximately one and eight tenths volts (1.8 volts).

48. A method as claimed in claim 41 further comprising the step of:
  providing up to twenty decibels (20 dB) of alternating current gain to said second input voltage signal in a single stage of analog signal equalization.

* * * * *